United States Patent
Oppelt et al.

(10) Patent No.: US 8,379,549 B2
(45) Date of Patent: Feb. 19, 2013

(54) REMOTELY FED MODULE

(75) Inventors: Ralph Oppelt, Uttenreuth (DE);
Markus Vester, Nuernberg (DE)

(73) Assignee: Siemens Aktiengesellschaft, Munich (DE)

( * ) Notice: Subject to any disclaimer, the term of this patent is extended or adjusted under 35 U.S.C. 154(b) by 497 days.

(21) Appl. No.: 12/645,829

(22) Filed: Dec. 23, 2009

(65) Prior Publication Data

US 2010/0157859 A1   Jun. 24, 2010

(30) Foreign Application Priority Data

Dec. 23, 2008  (DE) .......................... 10 2008 062 855

(51) Int. Cl.
*H04L 5/00* (2006.01)

(52) U.S. Cl. ...................................................... 370/297

(58) Field of Classification Search .................. 370/230, 370/235, 252, 297, 310, 316, 400, 401, 430, 370/436, 480, 481, 478, 338, 343, 344, 281; 324/322, 318, 301, 300, 357.76, 357.42, 324/357.46, 310.11, 357.73, 538.11; 607/2, 607/45, 46, 60; 600/411, 300, 301, 410, 600/412; 725/82, 117, 127, 131; 455/54.2, 455/56.1, 57.1, 83, 315, 11.1, 562.1, 102; 375/130, 257, 258

See application file for complete search history.

(56) References Cited

U.S. PATENT DOCUMENTS

| | | | |
|---|---|---|---|
| 5,526,348 A * | 6/1996 | Ichiyoshi ...................... 370/344 |
| 5,530,348 A * | 6/1996 | Heflinger ...................... 324/301 |
| 5,918,154 A * | 6/1999 | Beasley ........................ 455/11.1 |
| 6,081,229 A * | 6/2000 | Soliman et al. ........... 342/357.42 |
| 6,185,201 B1 * | 2/2001 | Kiyanagi et al. ............... 370/343 |
| 6,600,909 B1 * | 7/2003 | Nikulin et al. ................ 455/260 |
| 6,844,730 B2 * | 1/2005 | Feld et al. ....................... 324/318 |
| 2005/0068915 A1 * | 3/2005 | Atad et al. ..................... 370/316 |
| 2005/0209654 A1 * | 9/2005 | Boveja et al. ..................... 607/45 |
| 2006/0099909 A1 * | 5/2006 | Chang ........................... 455/12.1 |
| 2006/0192672 A1 * | 8/2006 | Gidge et al. ............. 340/538.11 |
| 2006/0214662 A1 * | 9/2006 | Adachi ........................... 324/322 |
| 2007/0087702 A1 * | 4/2007 | Kato et al. ..................... 455/102 |
| 2007/0135867 A1 * | 6/2007 | Klosterman et al. ............ 607/60 |
| 2008/0025276 A1 * | 1/2008 | Lee et al. ....................... 370/338 |
| 2008/0178227 A1 * | 7/2008 | Petrovic et al. ................. 725/68 |
| 2008/0214192 A1 * | 9/2008 | Soliman ........................ 455/436 |
| 2009/0327384 A1 * | 12/2009 | Petrovic ........................ 708/300 |
| 2011/0077501 A1 * | 3/2011 | Rofougaran ................. 600/410 |

* cited by examiner

*Primary Examiner* — Abdullah Riyami
(74) *Attorney, Agent, or Firm* — Schiff Hardin LLP

(57) ABSTRACT

In a method and device for the transmission of a multiplicity of signals having different frequencies between a base station and a module situated at a location remote from the base station via a single, common cable connection, some of the signals being transmitted from the electronic assembly to the module and, in general simultaneously, the remaining signals are transmitted in the opposite direction. Each of the base station and the module has bandpass filter bank therein having a multiplicity of bandpass filters, the number thereof being a function of the number of channels to be transmitted, with which the respectively received signals are spectrally separated from one another so that they are available for further signal processing in the base station, or for further use in the module.

30 Claims, 5 Drawing Sheets

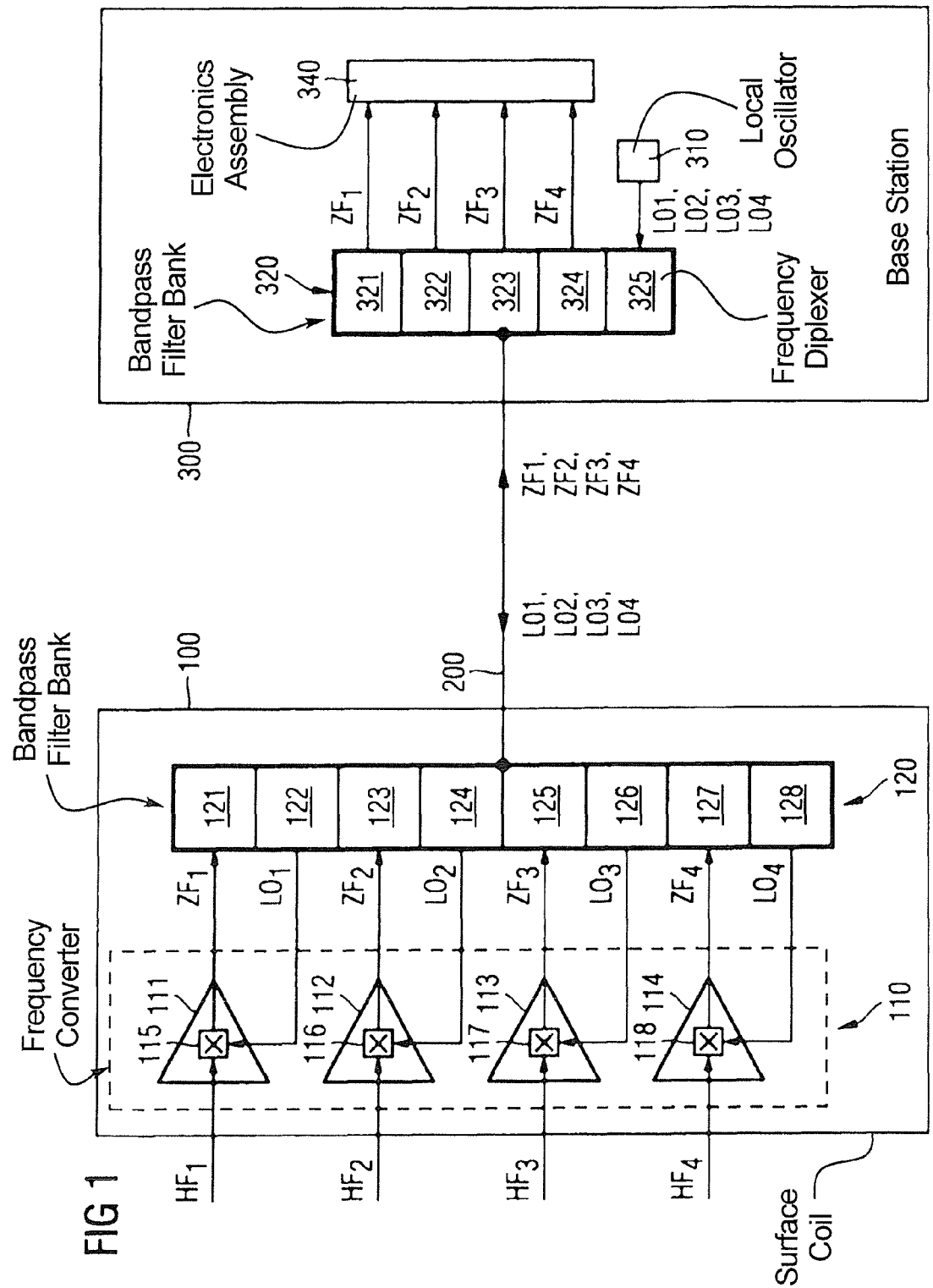

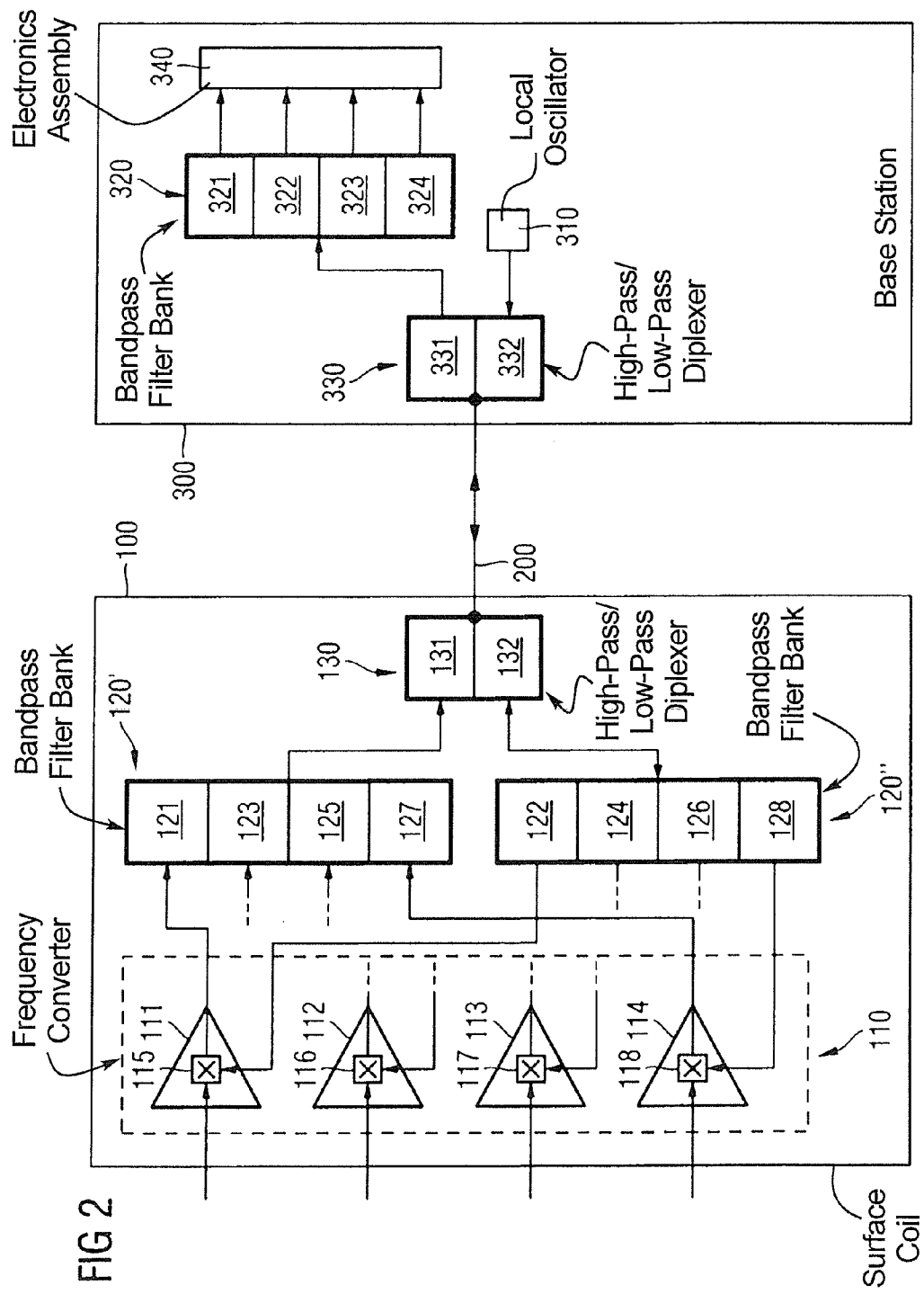

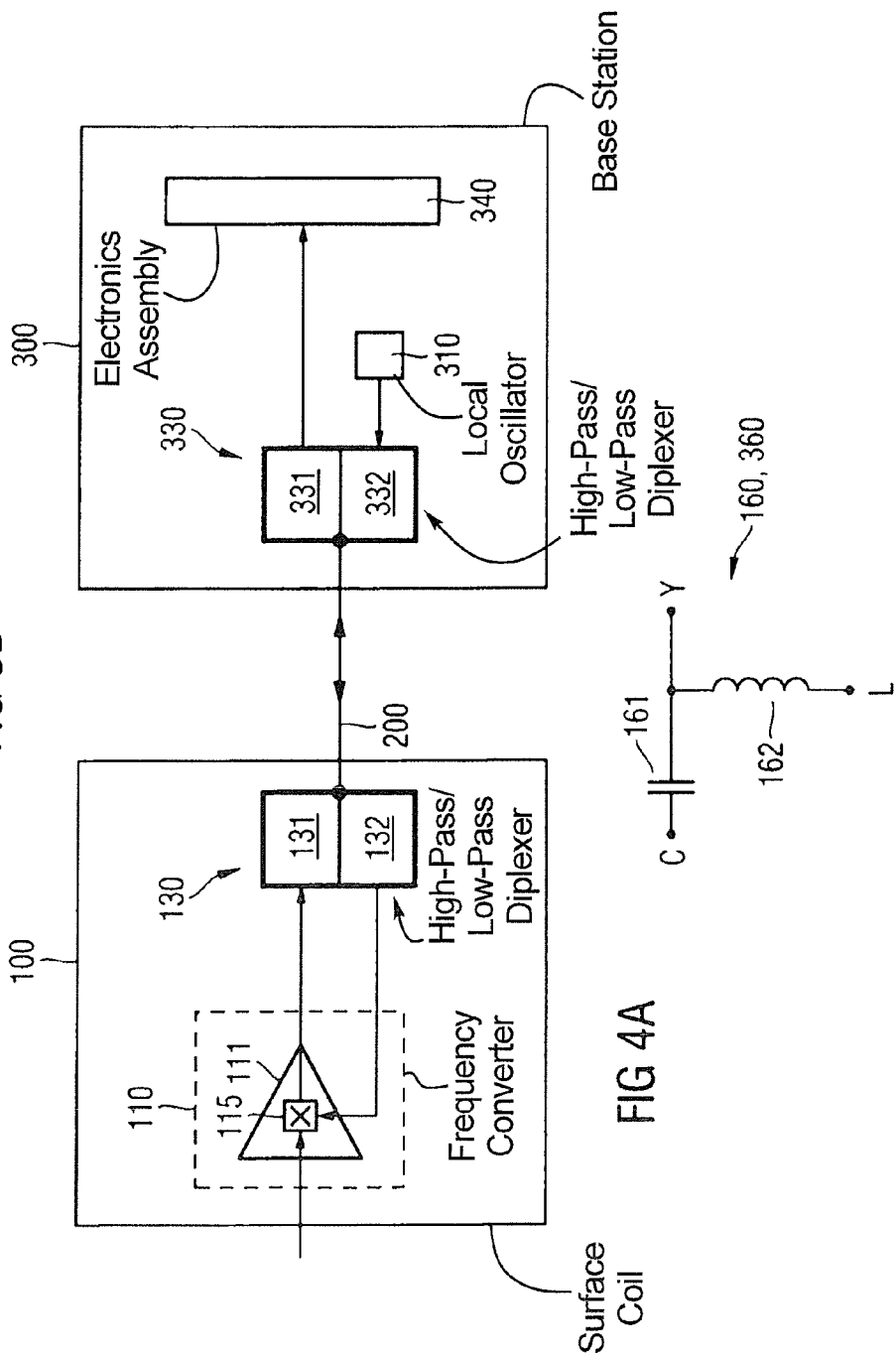

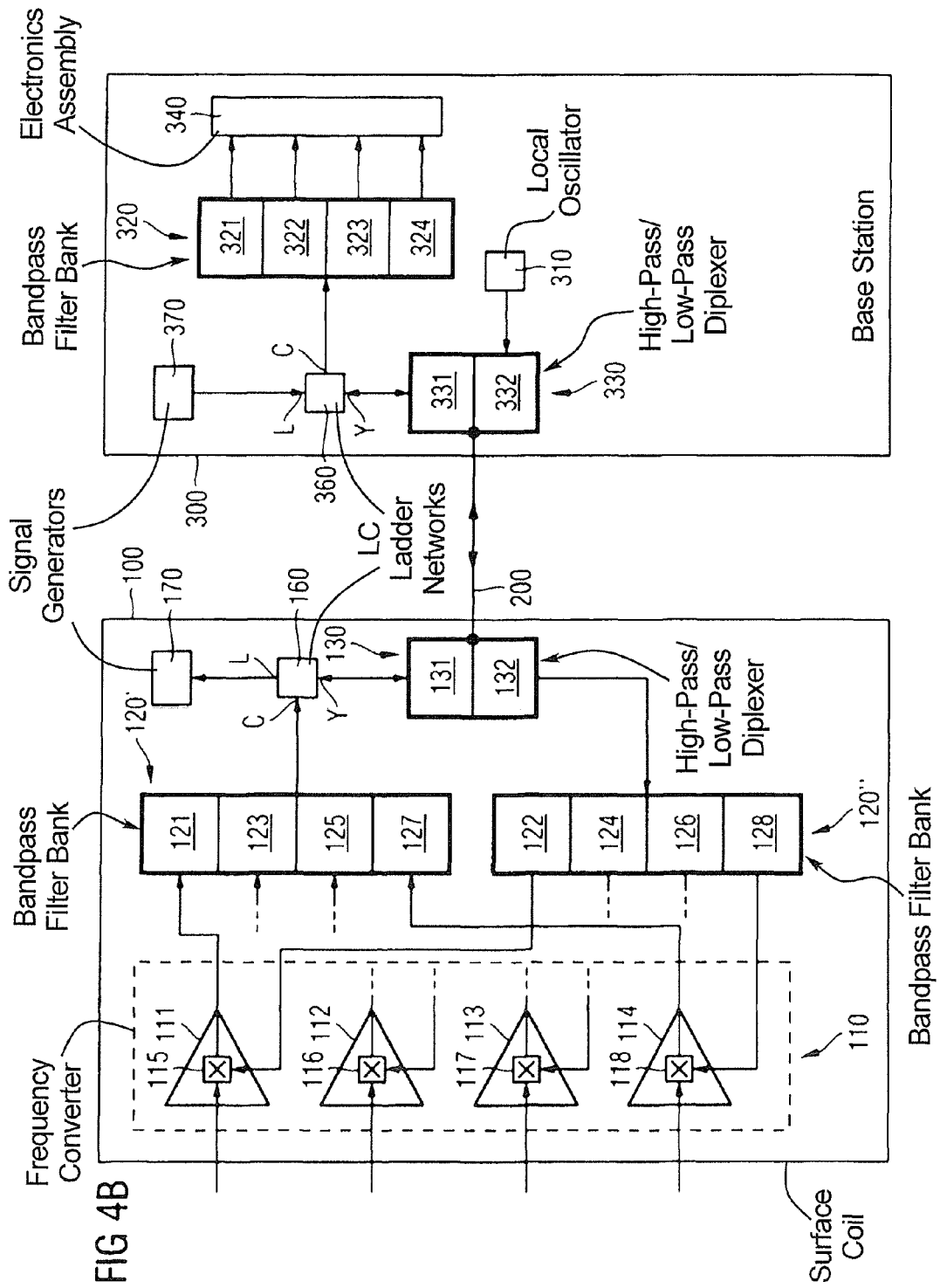

REMOTELY FED MODULE

BACKGROUND OF THE INVENTION

1. Field of the Invention

The present invention relates to the transmission of a multiplicity of signals between an electronic assembly and a module situated at a location remote from the electronic assembly, some of the signals being transmitted from the electronic assembly to the module and the remaining signals being transmitted in the opposite direction.

2. Description of the Prior Art

In an arrangement of the type described above, the electronic assembly can be a base station, for example, in which the signals that are to be transmitted to the module situated remote from the base station are produced and in which there takes place a signal processing of the signals communicated by the module takes place. The module can contain, for example, a module for converting the frequency of one or more signals, and can be fashioned, for example, as a frequency converter.

A module for frequency conversion, hereinafter designated a frequency converter, in which the frequency of a radio-frequency (RF) signal is converted to an intermediate frequency position, is generally supplied with a signal of a local oscillator (LO), called an LO signal. Correspondingly, the frequency converter requires, apart from the input line for the RF signal, a line for the LO signal and a line for the intermediate frequency signal (IF signal).

Such a frequency converter is attached, for example, to the tip of an antenna mast, where it receives RF signals from the surrounding environment that are to be converted into an IF signal. Due to atmospheric influences, however, a thermal drift of the frequency of the LO signal may occur if the local oscillator is integrated into the frequency converter. Alternatively, it is possible for example to transmit a highly stable LO signal from a remotely positioned local oscillator to the frequency converter via a cable connection. The local oscillator is ideally seated in or adjacent to the electronic assembly in which the IF signal, i.e. the output signal of the frequency converter, is also further processed. Correspondingly, the IF signal is also conducted via a cable connection to the electronic assembly positioned remote from the frequency converter.

If n channels, i.e. n RF signals having n generally different frequencies, are to be converted into n different IF bands, n different LO frequencies and n individual IF output lines are generally required. Accordingly, for n channels 2n lines must be provided—again, apart from the input lines for the RF signals that are to be converted.

Such a frequency converter for the conversion of n channels is used for example in magnetic resonance tomography (MRT) when surface or head coils having, for example, 128 channels are used. Correspondingly, for the LO and the IF signals 2×128=256 lines extend between the frequency converter of the coil and the electronic assembly in which, in this application situation, at least one local oscillator, as well as an analog and a digital electronics unit, are housed for postprocessing the IF signal. The signal detected by the coil is first amplified using a low-noise preamplifier and is then supplied to the frequency converter. For an optimal signal-to-noise ratio, the electrical connections between the pickoff point of the signals detected by the coil and the preamplifier should be as short as possible. If, however, the preamplified signals are first led out from the coil via longer lines and then supplied to the frequency converter, then due to the identical frequency there would be the danger of a feedback effect on the coil, accompanied by the production of unwanted oscillations and/or significant changes in frequency response. The frequency converter is therefore ideally situated as close as possible to the output of the preamplifier, and is typically integrated into the coil housing.

In addition to the e.g. 256 signals that have to be transmitted between the electronic assembly and the frequency converter, in the case of the surface coil or the head coil there is a further signal for the transmit/receive changeover of the surface coil, known as the PIN diode signal or PIN signal. For this PIN signal, in addition to the lines for the LO and IF signals, a further line is required between the surface coil and the electronic assembly.

In order to exclude for example disturbing influences due to RF excitation pulses or gradient fields to the greatest possible extent, for the example of MRT the electronic assembly is also standardly situated remotely from the frequency converter. Thus, a correspondingly large number of lines must be provided for the transmission of the LO, IF, and PIN signals.

The provision of such a large number of lines for the conversion of n channels is associated with a high outlay and corresponding costs.

In DE 101 48 467 A1, a number of magnetic resonance signals (MR signals) of a surface coil are mixed in various RF bands, and these RF bands are transmitted via a readout line. In addition, the direct voltage for the power supply, various control signals, and a synchronization frequency are transmitted via this line. The LO signals required for the mixing up are produced locally in the electronics of the surface coil, and are synchronized if warranted. However, the correspondingly necessary electronics outlay entails a large space requirement. Above all, however, the electronics causes a relatively high power loss, which in addition occurs in the vicinity of the patient and therefore can cause an unnecessary rise in the patient's temperature. The direct voltage for the supply of power to the electronics is also transmitted via this line, while for the transmission of PIN signals an additional electronics unit is required, entailing an additional space requirement and higher power loss.

As a generalization, and for better illustration of the fact that the module or frequency converter is situated remotely from the further signal processing, the electronic assembly in which, inter alia, the signal processing takes place is also designated a "base station," and the frequency converter is designated a "satellite." In the case of MRT, the satellite would then be a surface coil or a surface coil array, and the base station would be the assembly in which at least the further processing of the IF signals takes place.

SUMMARY OF THE INVENTION

An object of the present invention is to provide an uncomplicated arrangement with which, with a low outlay, a multiplicity of signals can be transmitted between a base station and a satellite.

According to the present invention, not only are signals that are produced in the satellite, that are, for example converted to an IF position, conducted via a cable to the base station, but also the individual LO signals are conducted from the base station to the satellite via the same cable.

The device according to the present invention fashioned to transmit at least one first signal and at least one second signal, having different frequencies, between a satellite and a base station via a single line. The first signal is transmitted in a first direction, from the satellite to the base station, and the second signal is transmitted in a second direction, from the base station to the satellite. The satellite has a first filter bank and the base station has a second filter bank. The filter banks are fashioned for the spectral separation of signals. The line connects the first and the second filter bank to one another for the transmission of the first and second signals.

In an embodiment, a number of second signals, having different frequencies, can be transmitted in the second direction, from the base station to the satellite. The first filter bank then has a multiplicity of first and second filters for the spectral separation of the signals supplied to the first filter bank. The second signals can be supplied to the first filters. In this way, it is achieved that only a single line is required even for the transmission of a multiplicity of signals to the satellite.

In addition, the satellite can have a module group that is connected to the first filters for the transmission of the signals that are spectrally separated from one another. The module group includes a number of modules for mixing the signals spectrally separated from one another with further, third signals received by the satellite, and for producing the first signals.

In a further embodiment, a number of first signals having different frequencies can be transmitted in the first direction, from the satellite to the base station. The second filter bank then has a multiplicity of third filters, in particular bandpass filters, for the spectral separation of the signals supplied to the second filter bank, the first signals being capable of being supplied to the third filters. In this way, it is achieved that only a single line is required even for the transmission of a multiplicity of signals to the base station.

The second signals are advantageously produced in a signal generator, an output of the signal generator being connected directly to the line for the transmission of the signals produced in the signal generator, or the output of the signal generator being connected to a further filter, in particular a bandpass filter, of the second filter bank and an output of the further filter being connected to the line.

In an embodiment, in the second direction, from the base station to the satellite, only one second signal can be transmitted via the line and supplied to the first filter bank. The first filter bank is then advantageously fashioned as a simple high-pass/low-pass diplexer having a low-pass filter and a high-pass filter, the second signal being supplied to the low-pass or to the highpass.

In a further embodiment, the high-pass/low-pass diplexer is connected to a module of a module group, the module being fashioned in order to mix the second signal with a further, third signal received by the satellite, and to produce an output signal.

In a further embodiment, in the first direction, from the satellite to the base station, only one first signal can be transmitted and supplied to the second filter bank, the second filter bank then advantageously being fashioned as a simple high-pass/low-pass diplexer having a low-pass and a high-pass filter, and the first signal being supplied to the low-pass filter or to the high-pass filter.

In a method according to the present invention for achieving the object of the invention, at least one first and at least one second signal, having different frequencies, are transmitted between a satellite and a base station via a single line, the first signal being transmitted in a first direction, from the satellite to the base station, and the second signal being transmitted in a second direction, from the base station to the satellite. The second signal, transmitted to the satellite, is supplied to a first filter bank of the satellite for the spectral separation of signals, and the first signal, transmitted to the base station, is supplied to a second filter bank of the base station for the spectral separation of signals.

Advantageously, a number of second signals having different frequencies are transmitted in the second direction, from the base station to the satellite. The second signals supplied to the satellite are spectrally separated from one another in the first filter bank using a multiplicity of filters, in particular bandpass filters. In this way, it is possible to transmit a multiplicity of signals to the satellite via a single line.

In a further embodiment, a number of first signals having different frequencies are transmitted in the first direction, from the satellite to the base station, the first signals, supplied to the base station, being spectrally separated from one another in a second filter bank having a multiplicity of filters, in particular bandpass filters. In this way, it is possible to transmit a multiplicity of signals to the base station via a single line.

It is particularly advantageous that the first and the second signal are transmitted over the line simultaneously.

In a further embodiment, an additional signal is produced in the base station that is also transmitted to the satellite via the line.

BRIEF DESCRIPTION OF THE DRAWINGS

FIG. 1 shows a first embodiment of a system for processing and transmitting four channels in accordance with the invention.

FIG. 2 shows a second embodiment a system for processing and transmitting four channels in accordance with the invention.

FIG. 3B shows a system for processing and transmitting one channel in accordance with the invention.

FIG. 4A shows a circuit for processing a PIN diode signal, and FIG. 4B show a system for processing and transmitting four channels, as well as the PIN diode signal in accordance with the invention.

DESCRIPTION OF THE PREFERRED EMBODIMENTS

Figure 3A:
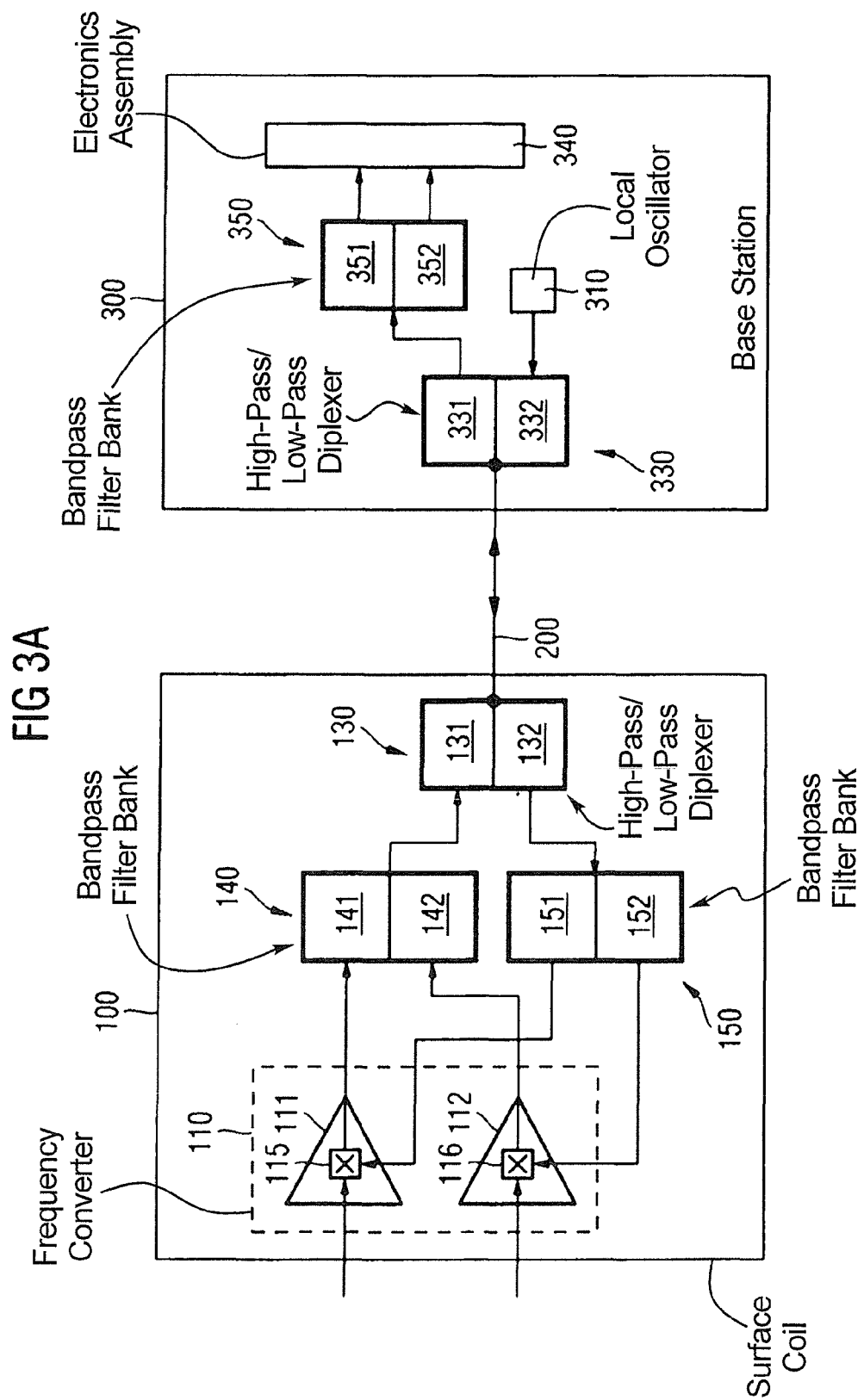
FIG. 3A shows a system for processing and transmitting two channels.

In the figures, identical or corresponding regions, components, assemblies of components, or method steps have been identified by the same reference characters. For better illustration, signal flow directions are indicated by arrows.

FIG. 1 shows a surface coil 100 that can be used in an MRT experiment for the detection of MRT signals. In such an experiment, surface coil 100 is situated directly at the measurement location and receives signals from a remotely situated base station 300. Typically, the patient to be examined and surface coil 100 are situated inside a tube of the MR tomograph. Base station 300, in contrast, is situated outside the tube of the tomograph, for example in the housing of the tomograph. Surface coil 100 is connected to an interface on the housing of the tomograph via a cable connection. The interface is in turn connected to the base station situated in the housing via a cabling that is internal to the housing, or is connected to the externally situated base station via a cable that leaves the housing of the tomograph.

For clarity, in the exemplary embodiment shown in FIG. 1 surface coil 100 is designed for only four channels. Accordingly, surface coil 100 receives four RF signals HF1, HF2, HF3, and HF4. These received RF signals are always at the same frequency position, but they carry different information and must therefore be processed individually. Therefore, the various signals must be converted to intermediate frequency positions, which require differing LO frequencies.

Signals HF1 through HF4 are supplied to a frequency converter 110 of surface coil 100, which is integrated into a housing of surface coil 100 and in which the frequencies of RF signals HF1 through HF4, received by the surface coil, are to be converted to various intermediate frequency positions.

Frequency converter 110 is fashioned as a module group, and has, corresponding to the four channels that are to be converted, four modules 111 through 114, each essentially containing a mixer 115 through 118. For example, signal HF1 and a signal LO1 are supplied to mixer 115, signal LO1 being a signal of a signal generator 310 of base station 300 and having a frequency f(LO1). Signal generator 310 can for example be a local oscillator. In mixer 115, signals HF1 and LO1 are mixed in a known manner, producing a signal ZF1 having a frequency f(ZF1) that is adjacent to an output of mixer 115 and thus to an output of module 111. The remaining modules 112 through 114, and remaining mixers 116 through 118, operate in a corresponding manner; i.e., signals HF2 and LO2 are supplied to mixer 116 of module 112 and a signal ZF2 having a frequency f(ZF2) is produced, signals HF3 and LO3 are supplied to mixer 117 of module 113 and a signal ZF3 having a frequency f(ZF3) is produced, and signals HF4 and LO4 are supplied to mixer 118 of module 114 and a signal ZF4 having a frequency f(ZF4) is produced. As is described below, signals LO1 through LO4 are produced in a local oscillator and have different frequencies.

Surface coil 100 has in addition a bandpass filter bank 120 that is also integrated into the housing of surface coil 100. Bandpass filter bank 120 comprises a multiplicity of bandpass filters; here the number of filters is a function of the number of channels that are to be received with surface coil 100, and two filters must be present per channel. In the exemplary embodiment, having four channels, bandpass filter bank 120 must have at least eight bandpass filters 121 through 128, each of the filters being conducting only for the frequency range required in the respective branch, and blocking outside this frequency range. So that the bandpasses can all be connected to one node without mutual influencing, it is always necessary first to connect a two-terminal network serially to the node that is high-ohmic in the blocking range. This is generally known from the theory of diplex filters, and is not explained here. In the simplest case, the overall path of a branch of the bandpass filter bank is made up only of a serially incorporated LC series oscillation circuit.

Each two bandpass filters of bandpass filter bank 120 are allocated to a module of frequency converter 110 and connected thereto. For example, the output of module 111, or of mixer 115, is connected to bandpass filter 121, so that the ZF1 signal can be supplied to filter 121. The input of module 111 or of mixer 115 for the LO1 signal is connected to filter 122; i.e., the LO1 signal is supplied to module 111 of bandpass filter 122. Modules 112 through 114 and mixers 116 through 118 are correspondingly connected to the remaining bandpass filters 123 through 128, as shown in FIG. 1.

Signals LO1 through LO4 and signals ZF1 through ZF4 are in general transmitted simultaneously via a single line 200 from and to bandpass filter bank 120 of surface coil 100. Line 200 is preferably a coaxial line, but may also be some other radio-frequency waveguide, such as for example a symmetrical two-lead cable. Line 200 is distinguished in that it is capable of transmitting the entire frequency spectrum of signals LO1 through LO4 and ZF1 through ZF4. For example, the lowest IF position can be 7.5 MHz, and the highest LO frequency can be 135 MHz. However, a frequency range between 1 MHz and 1000 MHz can also unproblematically be covered.

Signals LO1 through LO4 are produced with the aid of local oscillator 310 of base station 300, and are supplied to bandpass filter bank 120 via line 200. Local oscillator 310 is for example a generator that intrinsically produces all LO frequencies or signals. Alternatively, of course, it is also possible to use a plurality of individual generators or local oscillators, in which case each generator then produces only one of the signals LO1 through LO4. The signals originating from the individual generators can then easily be connected together on a line; here, decoupled combiners are preferably used. However, in the following reference is made only in general to local oscillator 310, which produces signals LO1 through LO4. In bandpass filter bank 120, with the aid of filters 122, 124, 126, and 128 there then takes place a spectral decomposition of the signals sent out by base station 300 into individual LO signals LO1 through LO4, which are finally supplied as described to modules 111 through 114 of frequency converter 110.

In the opposite direction, signals ZF1 through ZF4 are taken from filters 121, 123, 125, 127 of bandpass filter bank 120 and are conducted to base station 300 via line 200. Base station 300 has at least one bandpass filter bank 320 having a multiplicity of bandpass filters 321, 322, 323, 324, and has a local oscillator 310 for producing signals LO1 through LO4. Bandpass filter bank 320 has at least one additional bandpass filter 325 into which the output signals of local oscillator 310 are fed. A spectral separation of LO signals LO1 through LO4 from one another is not absolutely necessary; a common frequency diplexer 325 that divides the LO signals from the rest of the signals is sufficient. Frequency diplexer 325, or bandpass filter 325, allows the spectrum of signals LO1 through LO4 to pass through and blocks signals ZF1 through ZF4. In addition, base station 300 has an electronics assembly 340 having analog and digital electronics for post-processing of the IF signals.

The signals supplied to base station 300 via line 200 are conducted into bandpass filter bank 320, where a spectral separation of the received signals takes place. Correspondingly, signal ZF1 is to be taken from bandpass filter 321, while signals ZF2, ZF3, ZF4 are adjacent to outputs of bandpass filter 322. Finally, signals ZF1 through ZF4 are supplied to electronics assembly 340, where they are further processed using analog and/or digital hardware. Typically, the IF signals are further amplified in electronics assembly 340 and are then sampled using an ADC and converted into digital signals. These signals are supplied, for example via a light conductor connection (not shown), to an image computer situated outside the MRT examination chamber, in which MRT images are calculated from the IF signals using known methods, such as fast Fourier transformation.

In a multichannel frequency multiplexing system, such as that shown in FIG. 1, the signals mixed to the intermediate frequency positions are as a rule spectrally far removed from the LO signals. In most cases, the LO frequencies, and thus the IF bands, are lined up so as to be more or less equidistant spectrally. In order to reduce the outlay in the individual filter paths, it therefore makes sense, as is shown in FIG. 2, to fashion bandpass filter bank 120 as diplexer 130, or high-low-pass diplexer 130, and to first separate the IF and LO frequency ranges from one another in high-low-pass diplexer 130 using a low-pass 131 and a highpass 132. For this purpose, an expensive bandpass diplexer is not required, but only a high-low-pass diplexer, which is easier to realize and lower in attenuation. Here it is assumed that the LO and IF frequency ranges are not interleaved with one another, or that they do not overlap. In general, the frequency range for the LO signals can be spectrally higher or lower than that for the IF signals. Preferably, the LO signals are situated at a spectrally higher level and the IF signals are situated at a spectrally lower level, because lower frequencies are less attenuated in a cable. Accordingly, with this choice of the frequency positions the IF signals carrying the information that is to be evaluated are attenuated relatively little, which has a positive effect on the further signal processing. A reversed selection of the frequency positions would have the effect that the IF signals are more strongly attenuated, so that for example the signal-to-noise ratio would become worse, which would have a negative effect on the image quality.

In FIG. 2, bandpass filter bank 120 of surface coil 100 is divided into a IF bandpass filter bank 120' and a LO bandpass filter bank 120" having high-low-pass diplexer 130 connected before it. IF bandpass filter bank 120' contains bandpass filters 121, 123, 125, 127 for IF signals ZF1 through ZF4, while LO bandpass filter bank 120" comprises bandpass filters 122, 124, 126, 128 for LO signals LO1 through LO4. As described in connection with FIG. 1, individual bandpass filters 121 through 128 are connected to modules 111 through 114, or to mixers 115 through 118, of frequency converter 110. IF bandpass filter bank 120' is connected to low-pass 131 of high-low-pass diplexer 130; i.e., in the exemplary embodiment shown in FIG. 2 the frequency range of IF signals ZF1 through ZF4 is higher than that of LO signals LO1 through LO4. Correspondingly, LO bandpass filter bank 120" is connected to highpass 132 of high-low-pass diplexer 130. In FIG. 2, for clarity only the signal connections for the first and for the fourth channel are completely depicted as examples, i.e. the connections of modules 111 or, respectively 114 to the respective bandpass filters 121 and 122 or, respectively 127 and 128. The remaining connections between the modules of frequency converter 110 and the filters of the bandpass filter bank are merely indicated, but correspond to the connections depicted completely in FIG. 1.

At base station 300 as well, a high-low-pass diplexer 330 having a low-pass 331 and a highpass 332 is provided for the separation of the IF and LO frequency ranges. Low-pass 331 is connected to bandpass filters 321 through 324 of bandpass filter bank 320. Bandpass filter 325, still shown in FIG. 1, for signals LO1 through LO4 of local oscillator 310 is omitted here, because the LO signals can be fed directly into highpass 332 of high-low-pass diplexer 330.

For the special case in which only two channels are to be converted, or only two signals are to be transmitted, it is sufficient to use instead of the comparatively expensive bandpass filter banks 120' and 120" a high-low-pass diplexer in each case, as is shown in FIG. 3A. Instead of IF bandpass filter bank 120', a high-low-pass diplexer 140 is present having a low-pass 141 and a highpass 142, and in the place of LO bandpass filter bank 120" a high-low-pass diplexer 150 is present having a low-pass 151 and a highpass 152, the individual high-passes and low-passes taking over the functions of the bandpasses of bandpass filter banks 120' and 120". With regard to the signal run paths and connections, reference is made to the descriptions of FIGS. 1 and 2.

Still simpler is the system in which only one channel is to be processed. This is shown in FIG. 3B. Since only one channel is to be transmitted, there is, respectively, only one HF signal, one IF signal, and one LO signal. Bandpass filter banks 120, or 120' and 120", as well as 320, shown in FIGS. 1 and 2, are omitted without replacement, and there remain only the two high-low-pass diplexers 130 and 330, introduced in FIG. 2, for the separation of the IF signal from the LO signal.

For the case of MRT, the PIN signal can also be transmitted via line 200. The PIN signal is essentially a blocking voltage that is to be transmitted to surface coil 100 for the case in which the coil is to be used to receive signals, and a forward current, also to be transmitted to the coil, for the case in which the coil is to be used for transmission, where switching back and forth takes place between the receive state and the transmit state. In this way, the signal, which, regarded spectrally, resembles a zero-frequency quantity, can easily be separated from the other signals using a LC ladder network 160. This circuit 160, shown in FIG. 4A, which is composed essentially of a capacitor 161 and a coil 162, has three terminals L, C and Y, terminal L in the satellite, or in surface coil 100, as shown in FIG. 4B, being connected to a PIN diode 170. As is shown schematically in FIG. 4B, the circuit can be situated in the low-pass path between bandpass filter bank 120' and low-pass 131, behind the upstream separation of the LO and IF signals; i.e., in the exemplary embodiment shown in FIG. 2, terminal C is connected to bandpass filter bank 120' and terminal Y is connected to low-pass 131 of high-low-pass filter 130. The signal path between low-pass 131 and circuit 160 is used in two directions: the PIN signal runs from low-pass 131 to circuit 160, while the IF signals are conducted in the opposite direction.

A corresponding circuit 360 is likewise provided in base station 300. Here as well, circuit 360 is situated in the low-pass path, i.e. between low-pass 331 of high-low-pass filter 330 and filter bank 320. Terminal C of circuit 360 is connected to bandpass filter bank 320, and terminal Y is coupled to low-pass 331 of high-low-pass filter 330. Terminal L is connected to generator 370 of the PIN signal. The signal path between low-pass 331 and circuit 360 is used in two directions: the PIN signal runs from circuit 360 to low-pass 331, while the IF signals are connected in the opposite direction, in order to finally arrive at filter bank 320.

Both at satellite 100 and at base station 300, circuit 160 or, respectively 360 may also be positioned at another location. For example, circuit 160 or, respectively, 360 can also be situated in common line 200; the C terminal of circuit 160 is then connected to high-low-pass diplexer 130 and the Y terminal must point in the direction of base station 300. The C terminal of circuit 360 is correspondingly connected to high-low-pass diplexer 330 of base station 300, and the Y terminal of circuit 360 points towards surface coil 100.

However, the arrangement described in connection with FIG. 4B is to be preferred, because the choke of circuit 160, 360 must have a comparatively high inductance in order to be able to divide between the typically low frequencies of the IF signal and the PIN signal, which is a quasi-direct current signal. Accordingly, it is not to be excluded that circuit 160 or, respectively, 360 will no longer behave like a choke in the range of the LO frequencies (natural resonance, winding capacitance, etc.). Thus, it is to be preferred that circuit 160 or, respectively, 360 be incorporated into the low-pass path, where the LO signals are already coupled out.

The specific embodiment described in connection with the Figures provides only a single line for the transmission of all signals, where this line can be fashioned for example as a coaxial line. It would of course also be conceivable to use one line only for two signals, for example for signals LO1 and ZF1. In the case of the transmission of four channels, for which eight lines would normally be required for the transmission of the necessary four LO signals and four IF signals, according to the present invention only four coaxial lines would be required. It would equally be conceivable, for the four-channel system, for example to transmit all the signals (LO1, LO2, ZF1, ZF2) of channels 1 and 2 via one line, and to transmit all the signals (LO3, LO4, ZF3, ZF4) of channels 3 and 4 via a second line.

Although modifications and changes may be suggested by those skilled in the art, it is the intention of the inventors to embody within the patent warranted hereon all changes and modifications as reasonably and properly come within the scope of their contribution to the art.

We claim as our invention:

1. A communication system comprising:
   a base station;
   a satellite located remote from said base station;
   a single signal line connected between said base station and said satellite allowing a first signal, to be transmitted in a first direction from the satellite to the base station, and a second signal, having a different frequency from said first signal, to be transmitted in a second direction from said base station to said satellite;
   said satellite comprising a first filter bank that spectrally separates a plurality of first signals at transmitted via said single signal line in said first direction from said satellite and a plurality of second signals transmitted via said single signal line in said second direction to said satellite;
   said base station comprising a second filter bank that spectrally separates the plurality of second signals transmitted via said single signal line in said second direction from said base station and the plurality of first signals transmitted via said single signal line in said first direction to said base station; and
   said single signal line being connected between said first filter bank and said second filter bank to cause the plurality of first and second signals transmitted via said single signal line between said base station and said satellite to be respectively spectrally separated in said first and second filter banks; and
   said first filter bank at said satellite comprising a high-pass/low-pass diplexer comprising a low-pass path and a high-pass path, said second signal being supplied by said diplexer to said low-pass path or said high-pass path;
   wherein said satellite comprising a plurality of modules respectively connected to said diplexer that mix said second signal with a third signal supplied to said satellite, to produce the first signal of said satellite.

2. The communication system as claimed in claim 1 wherein said base station transmits the plurality of second signals, at respectively different frequencies, in said second direction to said satellite, and wherein said first filter bank at said satellite comprises a plurality of bandpass filters that respectively receive said plurality of second signals at said respectively different frequencies transmitted from said base station.

3. The communication system as claimed in claim 2 wherein said plurality of bandpass filters is a plurality of first bandpass filters, and wherein said first filter bank at said satellite comprises a plurality of second bandpass filters, and wherein said satellite comprises the plurality of modules respectively connected to said plurality of first bandpass filters, and each module being supplied with one of third signals and mixing one of said plurality of second signals with said third signal to produce said first signal, said modules each having an output at which one of said first signals is present.

4. The communication system as claimed in claim 3 wherein each output of each of said modules is connected directly to said single signal line.

5. The communication system as claimed in claim 3 wherein each output of each of said modules is connected to one of said plurality of second filters, said plurality of second filters being connected to said single signal line and respectively transmitting the first signal supplied thereto to said base station via said single signal line.

6. The communication system as claimed in claim 3 wherein said plurality of modules are either directly or indirectly connected to said single signal transmission line and transmit said first signals from said satellite to said base station, and wherein said second filter bank at said base station comprises a plurality of third bandpass filters that spectrally separate said plurality of first signals received at said base station from said satellite.

7. The communication system as claimed in claim 6 wherein said base station comprises a signal processor that processes said plurality of first signals received at said base station from said satellite.

8. The communication system as claimed in claim 1 comprising a signal generator at said base station that generates said second signals, said signal generator having an output connected directly to said single signal line.

9. The communication system as claimed in claim 1 wherein said base station comprises a signal generator that generates said second signals, said signal generator having an output connected to a further bandpass filter in said second filter bank, said further filter having a filter output connected to said single signal line.

10. The communication system as claimed in claim 1 wherein each of said modules has an output connected to said first filter bank, said first filter bank being connected to said single signal line.

11. The communication system as claimed in claim 1 wherein each of said modules has an output connected directly to said single signal line.

12. The communication system as claimed in claim 9 wherein said second signal is supplied to the high-pass path of said diplexer and said first signal is supplied to the low-pass path of said diplexer.

13. The communication system as claimed in claim 9 wherein said second filter bank comprises a high-pass/low-pass diplexer having a low-pass path and a high-pass path, and wherein said first signal transmitted to said base station from said satellite is supplied to said low-pass path or to said high-pass path.

14. The communication system as claimed in claim 13 comprising an electronics assembly connected to said second filter bank to which said first signal is supplied for signal processing.

15. The communication system as claimed in claim 1 wherein said base station comprises a signal generator that generates said second signal, said signal generator having an output that is selectively connectable either directly to said single signal line or to said second filter bank, said second filter bank having an output connected to said single signal line.

16. A method for communicating between a base station and a satellite located remote from said base station comprising the steps of:
   connecting said base station and said satellite with a single signal line allowing a first signal, to be transmitted in a first direction from the satellite to the base station, and a second signal, having a different frequency from said first signal, to be transmitted in a second direction from said base station to said satellite;
   providing said satellite with a first filter bank that spectrally separates a plurality of first signals transmitted via said single signal line in said first direction from said satellite and a plurality of second signals transmitted via said single signal line in said second direction to said satellite;

providing said base station with a second filter bank that spectrally separates the plurality of second signals transmitted via said single signal line in said second direction from said base station and the plurality of first signals transmitted via said single signal line in said first direction to said base station;

via said single signal line, transmitting between said first filter bank and said second filter bank and spectrally separating the plurality of first and second signals transmitted via said single signal line between said base station and said satellite respectively in said first and second filter banks; and forming said first filter bank at said satellite as a high-pass/low-pass diplexer comprising a low-pass path and a high-pass path, and supplying said second signal by said diplexer to said low-pass path or said high-pass path;

wherein at said satellite, connecting a plurality of modules respectively to said diplexer and mixing said second signal with a third signal supplied to said satellite in said modules to produce the first signal of said satellite.

17. The method as claimed in claim 16 comprising transmitting the plurality of second signals, at respectively different frequencies, from said base station in said second direction to said satellite, and forming said first filter bank at said satellite comprises a plurality of bandpass filters and respectively receiving said plurality of second signals at said respectively different frequencies transmitted from said base station through said bandpass filters.

18. The method as claimed in claim 17 wherein said plurality of bandpass filters is a plurality of first bandpass filters, and forming said first filter bank at said satellite also with a plurality of second bandpass filters and at said satellite, connecting the plurality of modules respectively to said plurality of first bandpass filters, and supplying each module with one of third signals and mixing one of said plurality of second signals with said third signal to produce said first signal, said modules each having an output at which one of said first signals is present.

19. The method as claimed in claim 18 comprising connecting each output of each of said modules directly to said single signal line.

20. The method as claimed in claim 18 comprising connecting each output of each of said modules to one of said plurality of second filters, and connecting said plurality of second filters to said single signal line and respectively transmitting the first signal supplied thereto to said base station via said single signal line.

21. The method as claimed in claim 18 comprising connecting said plurality of modules either directly or indirectly to said single signal transmission line and transmitting said first signals from said satellite to said base station, and comprising forming said second filter bank at said base station of a plurality of third bandpass filters and in said plurality of third bandpass filters, spectrally separating said plurality of first signals received at said base station from said satellite.

22. The method as claimed in claim 21 comprising, at said base station, processing said plurality of first signals received at said base station from said satellite in a signal processor.

23. The method as claimed in claim 16 comprising generating said second signals with signal generator at said base station having an output connected directly to said single signal line.

24. The method as claimed in claim 16 comprising generating said second signals with a signal generator at said base station having an output connected to a further bandpass filter in said second filter bank, and connecting a filter output of said further bandpass filter to said single signal line.

25. The method as claimed in claim 16 comprising connecting an output of each of said modules to said first filter bank, and connecting said first filter bank to said single signal line.

26. The method as claimed in claim 16 comprising connecting the output of each of said modules directly to said single signal line.

27. The method as claimed in claim 16 comprising supplying said second signal to the high-pass path of said diplexer and supplying said first signal to the low-pass path of said diplexer.

28. The method as claimed in claim 16 comprising forming said second filter bank as a high-pass/low-pass diplexer having a low-pass path and a high-pass path, and supplying said first signal transmitted to said base station from said satellite to said low-pass path or to said high-pass path.

29. The method as claimed in claim 28 comprising connecting said second filter bank to an electronics assembly to which said first signal is supplied for signal processing.

30. The method as claimed in claim 16 comprising generating said second signal with a signal generator at said base station having an output, and selectively connecting said output either directly to said single signal line or to said second filter bank, and connecting an output of said second filter bank to said single signal line.

* * * * *